(12) United States Patent
Narayanan

(10) Patent No.: US 9,209,396 B2
(45) Date of Patent: Dec. 8, 2015

(54) REGULATING INTERFACE LAYER GROWTH WITH $N_2O$ FOR TWO-TERMINAL MEMORY

(71) Applicant: Crossbar, Inc., Santa Clara, CA (US)

(72) Inventor: Sundar Narayanan, Cupertino, CA (US)

(73) Assignee: Crossbar, Inc., Santa Clara, CA (US)

( * ) Notice: Subject to any disclaimer, the term of this patent is extended or adjusted under 35 U.S.C. 154(b) by 237 days.

(21) Appl. No.: 13/912,136

(22) Filed: Jun. 6, 2013

(65) Prior Publication Data

US 2014/0335675 A1 Nov. 13, 2014

Related U.S. Application Data

(60) Provisional application No. 61/786,058, filed on May 8, 2013.

(51) Int. Cl.
*H01L 45/00* (2006.01)
*H01L 27/24* (2006.01)

(52) U.S. Cl.
CPC .......... *H01L 45/1608* (2013.01); *H01L 45/085* (2013.01); *H01L 45/1233* (2013.01); *H01L 45/1266* (2013.01); *H01L 45/145* (2013.01); *H01L 45/1633* (2013.01); *H01L 27/249* (2013.01)

(58) Field of Classification Search
None
See application file for complete search history.

(56) References Cited

U.S. PATENT DOCUMENTS

| | | | |
|---|---|---|---|
| 7,927,472 B2* | 4/2011 | Takahashi et al. | 204/298.03 |
| 2011/0183525 A1* | 7/2011 | Purushothaman et al. | 438/778 |
| 2013/0023085 A1* | 1/2013 | Pramanik et al. | 438/104 |

* cited by examiner

*Primary Examiner* — Angel Roman
(74) *Attorney, Agent, or Firm* — Amin, Turocy & Watson, LLP

(57) ABSTRACT

Provision of fabrication, construction, and/or assembly of a two-terminal memory device is described herein. The two-terminal memory device can include an active region with a silicon bearing layer, an interface layer, and an active metal layer. The interface layer can be grown on the silicon bearing layer, and the growth of the interface layer can be regulated with $N_2O$ plasma.

20 Claims, 9 Drawing Sheets

REGULATING INTERFACE LAYER GROWTH WITH N₂O FOR TWO-TERMINAL MEMORY

CROSS-REFERENCES TO RELATED APPLICATIONS

This present invention claims priority to and is a non-provisional of U.S. Application No. 61/786,058, filed on May 8, 2013. That application is herein incorporated by reference for all purposes.

TECHNICAL FIELD

This disclosure generally relates to semiconductor fabrication, and more particularly to controlling oxide growth for two-terminal memory cells with the introduction of $N_2O$.

BACKGROUND

Resistive-switching memory represents a recent innovation within the field of integrated circuit technology. While much of resistive-switching memory technology is in the development stage, various technological concepts for resistive-switching memory have been demonstrated by the inventors and are in one or more stages of verification to prove or disprove associated theories or techniques. The inventors believe that resistive-switching memory technology shows compelling evidence to hold substantial advantages over competing technologies in the semiconductor electronics industry.

The inventors believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventors believe that arrays of many such memory cells, can provide many bits of digital memory storage.

The inventors have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventors have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventors desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Systems disclosed herein relate to controlling or regulating growth of an interface layer of a two-terminal memory cell with $N_2O$ plasma. For example, a memory fabrication component can facilitate fabrication of a two-terminal memory cell with an active region comprising a silicon bearing layer, an interface layer situated atop the silicon bearing layer, and an active metal layer situated atop the interface layer. The memory fabrication component can include a formation component that can be configured to facilitate introduction of $N_2O$ plasma in connection with an oxidation period characterized by growth of a controlled oxide comprising the interface layer.

Methods disclosed herein relate to introducing $N_2O$ plasma in connection with fabricating a two-terminal memory device. Such can be accomplished by receiving a silicon bearing layer associated with a two-terminal memory device at a growth chamber. The method can include introducing a plasma comprising $N_2O$ into the growth chamber. The method can further include facilitating growth of an oxide on the silicon bearing layer, the oxide comprising an interface layer between the silicon bearing layer and an active metal layer. In various embodiments, the oxide may be a sub-oxide, e.g. $SiO_x$, $0<x<2$.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION INTRODUCTION

Figure 1:
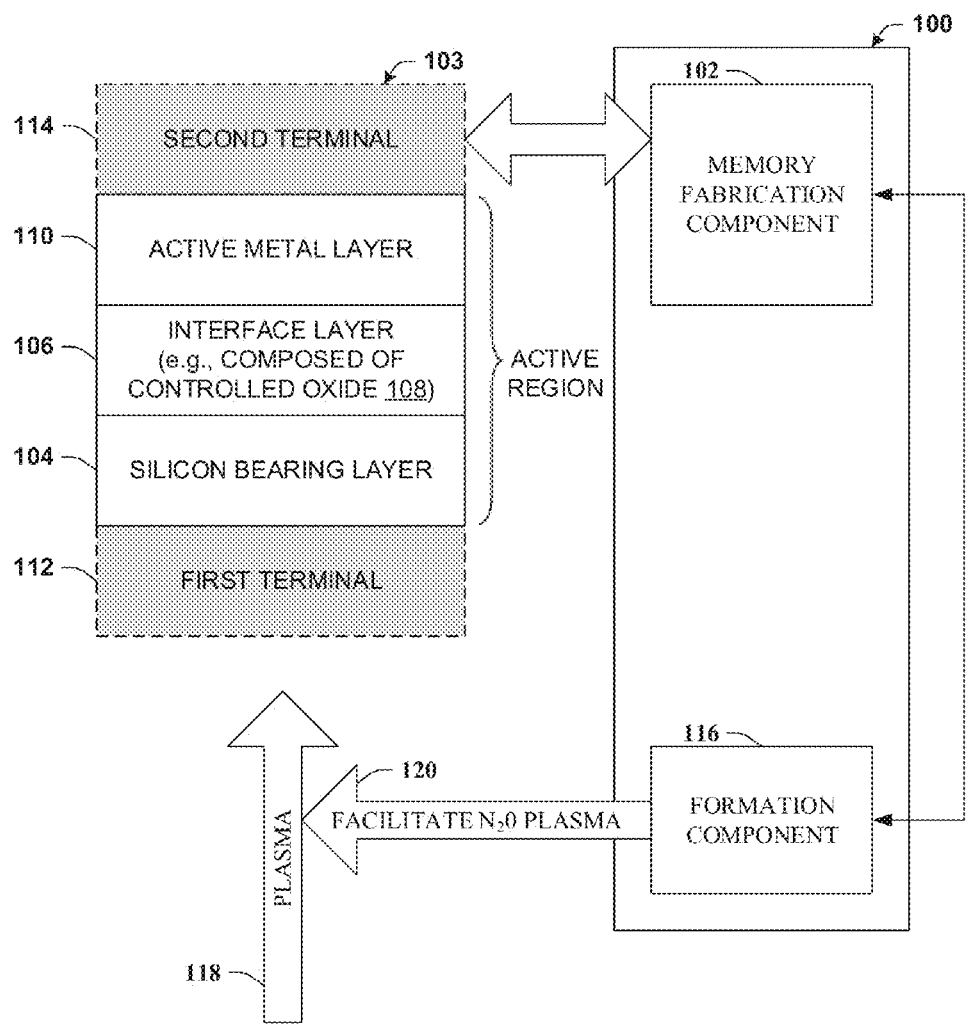
FIG. 1 illustrates a block diagram of an example system that can provide for regulating growth of an oxide with $N_2O$ plasma in connection with fabrication of a two-terminal memory cell in accordance with certain embodiments of this disclosure.

In two-terminal memory cells, particularly resistive-switching memory cells, the portions of the cell between the two terminals are denoted herein as the active region of the cell. This active region can include an interface layer between a silicon bearing layer and an active metal layer, all of which are further detailed herein. The interface layer in particular plays a significant role in the switching properties of a two-terminal memory cell (e.g., a resistive-switching memory cell such as a resistive random access memory (RRAM) cell). The interface layer can be formed as a byproduct of the silicon bearing layer prior to the deposition of the active metal layer. Additionally or alternatively, the interface layer can be grown or deposited with process control techniques that enable precise device specifications.

The interface layer formed as a byproduct, may include silicon, oxygen, germanium, titanium, or another transition metal oxide. In some embodiments, the interface layer is a byproduct, of a post etch ashing process, a post etch cleaning process, a pre-deposition cleaning process, or the like, depending on the integration scheme which is further detailed with reference to FIGS. 4A and 4B.

Integrating or using these byproduct layers of the active region to form a high quality memory cell sometimes presents a number of challenges. For example, it can be difficult to control byproduct interface layer thickness across adjacent devices, across an entire wafer, and from wafer-to-wafer. Existing process controllability sometimes does not meet requirements typical of semiconductor manufacturing processes. Further, controlling the composition of the byproduct interface layer in a uniform manner can sometimes be difficult. In the case of certain two-terminal memory cells, a typical desired thickness for the byproduct interface layer ranges from 1 nanometer (nm) to 12 nm. In light of the above, the inventors believe that the interface layers should be specifically engineered in some cases.

One proposed solution is to deliberately remove the byproduct interface layers via a cleaning process. After cleaning, oxides, or the like that previously existed on the silicon bearing layer are reduced and/or removed. Subsequently an engineered interface layer can be grown from a new, controlled oxidation process on top of the silicon bearing layer, prior to deposition of the active metal layer. In other embodiments, the engineered interface layer may be deposited. In some embodiments, deposited engineered interface layers may sometimes be associated with additional challenges.

In some embodiments, the challenges include that the engineered interface layer should be only a few nanometers thick, which is sometimes too thin for conventional deposition techniques. In various embodiments depositing an interface layer on the order of a few nanometers in thickness would generally require an atomic layer deposition (ALD) process to attain adequate manufacturability. In some embodiments, ALD processes require expensive equipment and are inherently higher temperature processes, above the temperature limit for building cells atop a complementary metal oxide semiconductor (CMOS) architecture. Therefore, ALD-fabricated cells are generally more expensive to manufacture and may have lower range of useful applications. Furthermore, ALD-fabricated cells can be associated with in denser stoichiometric oxides that resist filament formation, therefore requiring higher voltages when programming or otherwise changing the state of the cell. In some cases ALD-fabricated cells are also associated with native oxides being formed upon silicon bearing layers prior to the deposition process.

Fabricating a two-terminal memory cell by way of growing (as opposed to deposition) of the engineered interface layer can be beneficial for a number of reasons. For example, growing an engineered/controlled oxide (e.g. sub-oxide) on an exposed surface of the silicon bearing layer (e.g., prior to active metal deposition) can be accomplished in a controlled fashion, employing existing semiconductor processing equipment that is common and inexpensive. Additionally, the growing process can be readily integrated into existing manufacturing processes, for example, integrated as part of a post etch cleaning process. Further, the growing process can be accomplished in a relatively low-temperature environment (e.g., about 300 degrees Celsius or below) that is compatible with CMOS substrates. In addition, the growing process can provide a simple oxide (e.g. silicon sub-oxide) within the desired thickness ranges and with the desired attributes.

One manner of facilitating the oxide growth is to expose the silicon bearing layer to $O_2$ plasma, which facilitates oxidation of the exposed portions of the silicon bearing layer. However, exposure to $O_2$ plasma typically results in very rapid oxidation rates, which can lead to certain additional difficulties. For instance, if the oxidation occurs too rapidly, it can be difficult to limit the thickness of the interface layer, since the manufacturing process requires a discrete amount of time to deposit the active metal layer. Similarly, oxides resulting from $O_2$ plasma tend to be denser than is desired. Such an increased density can result in higher operating voltages during operation (e.g., to form the filament and/or change states of the cell).

In order to address these and other difficulties, the disclosed subject matter relates to employing $N_2O$ plasma in connection with a process for growing the interface layer of a two-terminal memory cell. Compared to $O_2$ plasma, use of $N_2O$ plasma can extend the associated oxidation period. Thus, an oxide (e.g., composing the interface layer) grown in response to introduction of $N_2O$ plasma will generally require more time to reach a desired thickness as opposed to an oxide grown in response to introduction of $O_2$ plasma, which can increase the manufacturability of the former over the latter. Also, the oxide grown in response to introduction of $N_2O$ plasma will typically exhibit a lower density than the oxide grown in response to introduction of $O_2$ plasma, which can advantageously reduce operation voltages associated with the memory cell in use. Furthermore, use of $N_2O$ plasma can maintain the thermal budget imposed by CMOS substrates, so that memory cells produced accordingly can function in connection with CMOS architectures.

Example of Regulating Interface Layer Growth with $N_2O$

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, system 100 is depicted. System 100 can provide for regulating growth of an oxide (e.g. silicon sub-oxide) with $N_2O$ plasma in connection with fabrication of a two-terminal memory cell. System 100 can include a memory that stores computer executable components and a processor that executes computer executable components stored in the memory, examples of which can be found with reference to FIG. 8. It is to be appreciated that the computer 802 can be used in connection with implementing one or more of the systems or components shown and described in connection with FIG. 1 or other figures disclosed herein. As depicted, system 100 can include a memory fabrication component 102 and a formation component 116.

Memory fabrication component 102 can be configured to fabricate or facilitate fabrication of two-terminal memory cell/device 103. Two-terminal memory cell 103 can include first terminal 112, second terminal 114, and an active region in between. The active region can be constructed comprising silicon bearing layer 104, interface layer 106 (which can be composed of or comprise one or more controlled oxide(s) 108), and active metal layer 110. In some embodiments, two-terminal memory cell 103 can be a resistive-switching memory cell, an example of which is provided with reference to FIG. 2.

Figure 2:
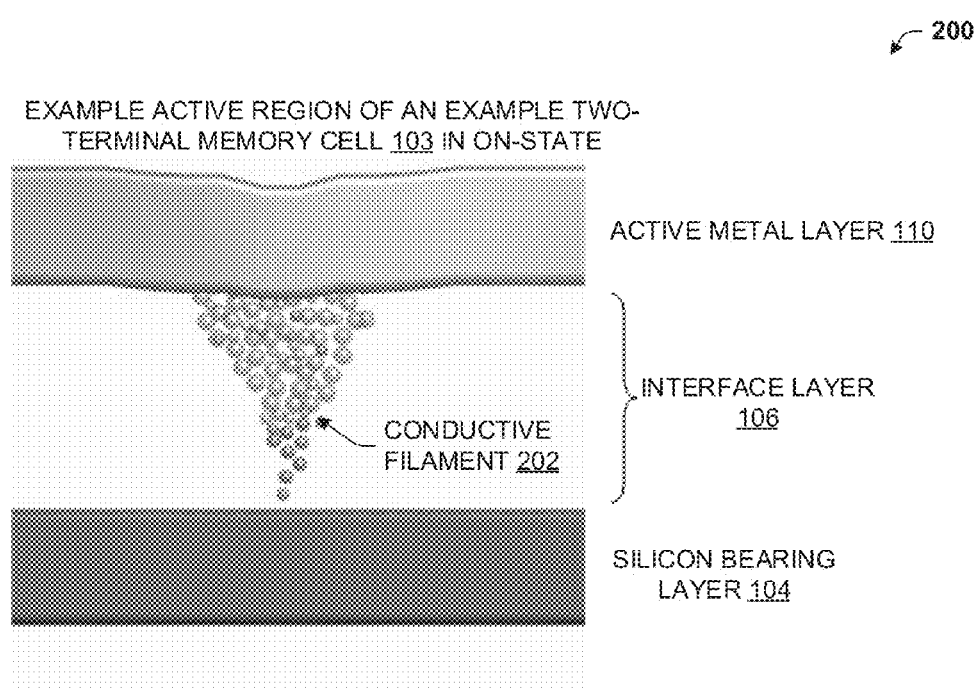
FIG. 2 depicts an example illustration of a cross-section of an example active region of an example two-terminal memory cell in accordance with certain embodiments of this disclosure.

While still referring to FIG. 1, but turning also now to FIG. 2, illustration 200 is provided. Illustration 200 depicts a cross-section of an example active region of an example two-terminal memory cell 103. In order to provide additional detail or context, it is understood that this disclosure relates to two-terminal memory cells, particularly resistive switching two-terminal memory cells, in various embodiments. Resistive switching two-terminal memory cells (also referred to as resistive switching memory cell(s) or device(s)), as utilized herein, comprise circuit components having two electrical contacts (also referred to herein as electrodes or terminals) with an active region between the two conductive contacts. An example of the active region of the two-terminal memory device is provided by illustration 200. This active region can exhibit a plurality of stable or semi-stable resistive states, each resistive state having different electrical resistance. Moreover, respective states of the plurality of states can be formed or activated in response to a respective voltage difference applied at the two conductive contacts. One example of a resistive switching two-terminal memory device, though not exhaustive, can include a resistive random access memory (RRAM) cell or device.

Embodiments of the subject disclosure can provide a filamentary-based memory cell. For example, in a 'programmed' or 'on' state, conductive filament 202 can form when ions from active metal layer 110 permeate interface layer 106, generally in response to a program voltage applied across the terminals 112, 114, which is further detailed infra. One example of a filamentary-based memory cell can comprise: a p-type or n-type silicon (Si) bearing layer (e.g., p-type or n-type polysilicon, p-type or n-type silicon germanium (SiGe), . . . ), the interface layer 106 (also referred to as a resistive switching layer (RSL) or a resistive switching material layer (RSML)) and an active metal layer for providing filament forming ions to the interface layer 106. The p-type or n-type Si bearing layer can include a p-type or n-type polysilicon, p-type or n-type SiGe, or the like. The interface layer 106 can comprise, e.g., an undoped amorphous Si layer, a semiconductor layer having intrinsic characteristics, a Si sub-oxide, and so forth.

Examples of the active metal layer 110 can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer 110 in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

To program one or more disclosed embodiments, a suitable program voltage can be applied across the memory cell causing a conductive filament to form through a resistive portion of the memory cell as mentioned above. This can further cause the memory cell to switch from a relatively high resistive state, to a relatively low resistive state. An erase process can be implemented to reverse the foregoing, at least in part, causing the memory cell to return to the high resistive state from the low resistive state. This change of state, in the context of memory, can be associated with respective states of a binary bit. Accordingly, multiple such memory cells 103 can be programmed or erased to represent respective zeroes or ones of binary information, and by retaining those states over time in effect storing binary information. For various reasons, in some embodiments, resistive switching memory cells are generally quick to program and responsive, changing state readily in response to a program voltage. This quick switching of state is a significant advantage of various disclosed memory cells over other memory cell technologies.

As applied to illustration 200, when a suitable program voltage (e.g., a positive voltage) is applied across the terminals of two-terminal memory cell 103, ions from active metal layer 110 move into the adjacent interface layer 106, which is at least partially permeable to the ions that collectively form conductive filament 202. Conductive filament 202 can span the entire thickness or a portion of the interface layer 106, facilitating electrical conductivity through the interface layer 106. When the program voltage is applied and conductive filament 202 forms, the memory cell is said to be in the on-state, which is a low-resistance state. In response to a suitable erase voltage (e.g., a negative voltage), conductive filament 202 can at least in part deform or retract, breaking the electrical conductive path. Such is a high-resistance state, associated with an off-state. The state can be determined by measuring current through cell 103 when a suitable read voltage is applied. The read voltage generally is not sufficient (or the proper polarity) to either form or de-form conductive filament 202, so current readings associated with the read current can be used to determine if the cell is in the high-resistance state (e.g., off) or the low-resistance state (e.g., on). In this example, two-terminal memory cell 103 is in the on state, with conductive filament spanning interface layer 106.

It should be appreciated that a variety of resistive switching memory cell technologies exist, having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage. Where an embodiment does not specify a unipolar or bipolar characteristic, or does not indicate suitable program/erase voltages, it is intended that such aspects and embodiments incorporate any suitable memory cell technology and can be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Many of these devices include materials that are incompatible with many common CMOS fabrication processes. Accordingly, expensive fabrication overhead costs (e.g., retooling, redesign, retesting, etc.) are projected in association with producing these devices. In addition, these devices can exhibit relatively slow switching speeds, small on/off resistance ratios (e.g., leading to small sensing margin) or poor thermal stability, as well as other problems.

Compatibility with CMOS fabrication processes is believed by the inventors of the present disclosure to be a significant factor related to fabrication cost reduction for new types of electronic memory. Some proposed resistive-switching memory cells are constrained by CMOS fabrication constraints, including process temperature(s), memory cell material(s), wiring or electrode material(s), memory cell material(s), dopant material(s), and so forth. For example, to avoid overhead costs in retooling CMOS fabrication equipment, embodiments of the resistive-switching memory can often involve memory elements built on a Si wafer. Interconnecting the Si wafer and the memory elements can involve several layers of interconnects, often involving metals such as Aluminum (Al) or Copper (Cu). Due to relatively low softening temperatures of these metals, fabrication of the memory elements can be constrained to 450 degrees Celsius or lower (e.g., for Al interconnect technology).

Still referring to FIG. 1, and with the foregoing in mind, it is understood that temperatures employed for CMOS-related fabrication can limit the materials that might be employed or the fabrication processes used. As one example, atomic layer deposition (ADL) can be employed to deposit a thin film between silicon bearing layer 104 and active metal layer 110. However, the ADL process is quite expensive in terms of equipment and is a very high-temperature process, exceeding the thermal budget of CMOS-related fabrication. Accordingly, the inventors of the present application believe that a low temperature process for forming interface layer 106 constitutes an improvement in two-terminal and/or resistive-switching memory cell technology. Such improvements can include increasing manufacturability, improved density or stoichiometry parameters, mitigating or avoiding costs of retooling and redesigning CMOS-related fabrication equipment, compatibility with existing patterning and etching processes, and others.

Accordingly, memory fabrication component 102 and/or system 100 can facilitate growing controlled oxide 108 (which can represent interface layer 106) atop silicon bearing layer 104 in a manner that provides numerous advantages, such as those noted above. In particular, controlled oxide 108 can be grown on silicon bearing layer 104 by introduction of plasma 118 (e.g. NO2 plasma). System 100 can include formation component 116 that can, inter alia, monitor, regulate, and/or control parameters associated with plasma 118. For example, formation component 116 can be configured to facilitate introduction of $N_2O$ plasma denoted by reference numeral 120. The introduction of $N_2O$ plasma can occur in connection with an oxidation period characterized by growth of controlled oxide 108 comprising interface layer 106.

Figure 3A:
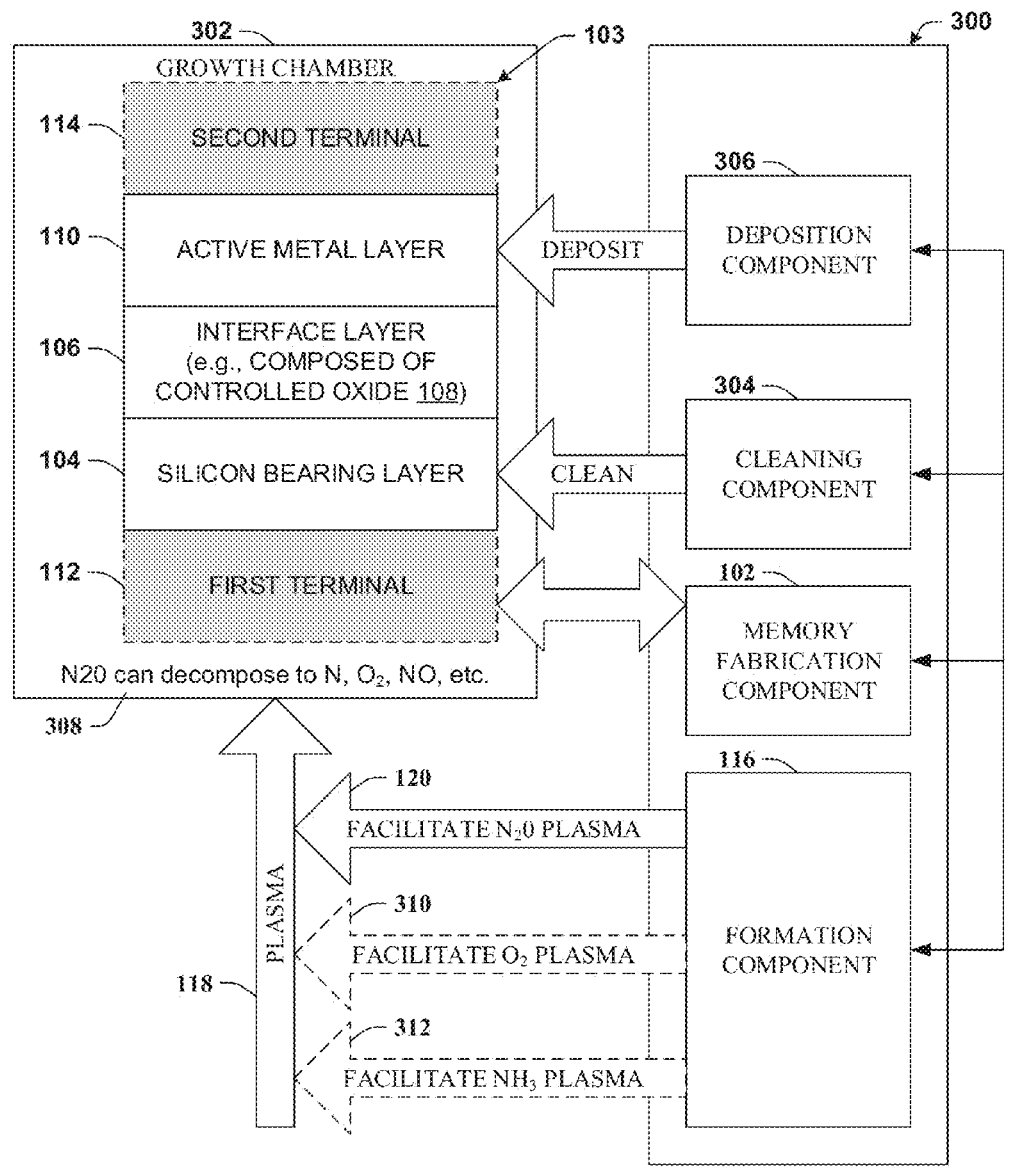
FIG. 3A illustrates a block diagram of an example system that can provide for additional features or aspects in connection with regulating interface layer growth with $N_2O$ plasma in accordance with certain embodiments of this disclosure.

Referring now to FIG. 3A, system 300 according to various embodiments is provided. System 300 can provide for additional features or aspects in connection with regulating interface layer growth with $N_2O$ plasma. For example, FIG. 3A illustrates once more example two-terminal memory 103 post-fabrication. However, during fabrication, and in particular during fabrication of the active region facilitated by memory fabrication component 102, silicon bearing layer 104 can be introduced to growth chamber 302, where plasma 118 can be introduced.

As discussed in connection with FIG. 1, and similarly here, formation component 116 can facilitate introduction of $N_2O$ plasma 120. For instance, in some embodiments, plasma 118 can be comprised entirely of $N_2O$ plasma 120. In other embodiments, plasma 118 can be comprised of $N_2O$ plasma 120 as well as other reagents such, for example, $O_2$ plasma (denoted by reference numeral 310), $NH_3$ plasma (denoted by reference numeral 312) or other suitable materials in a plasma state.

Solutions that exclusively utilize $O_2$ plasma (and therefore do not provide for application of $N_2O$ plasma) can of course yield an oxide-based interface layer. However, in some cases, a number of difficulties arise. Specifically, such an oxide forms very rapidly, which can significantly reduce manufacturability; and such an oxide in some instances forms with a denser composition as opposed to densities achieved in connection with utilization of $N_2O$ plasma.

Use of $N_2O$ plasma, as provided for by formation component 116 can provide for significant advantages. For example, as illustrated at reference numeral 308, $N_2O$ plasma typically slowly and steadily decomposes to N, $O_2$, NO, and other suitable species as would be known by one of ordinary skill in the art or made known by way of the context provided herein.

Hence, a smaller proportion of the environment provided by growth chamber 302 is composed of oxygen, which is necessary for the oxidation process, than in the case of use of an $O_2$ plasma. As a result, the oxidation period characterized by growth of controlled oxide 108 can be longer. In some embodiments, oxidation by way of chemicals into which $N_2O$ plasma decomposes can impart certain desirable characteristics to controlled oxide 108 and/or operating characteristics associated with memory cell 103. In certain embodiments, a desired thickness of interface layer can be between 1 nanometer and 12 nanometers.

Therefore, considering the case in which it is desired to have a particular controlled oxide 108 reach a thickness of a few nanometers, the oxidation period might only be, for example, five seconds when exposing silicon bearing layer 104 to pure $O_2$ plasma. In contrast, when introducing $N_2O$ plasma (as opposed to $O_2$ plasma), the associated oxidation period required to grow controlled oxide 108 to the desired thickness might be, e.g., 15 seconds. Such additional time associated with the oxidation period can be significant in terms of maintaining a uniform interface layer 106 across adjacent memory cells, across an entire wafer, and even wafer-to-wafer, as well as other improvements associated with manufacturability.

Additional advantages exist. For example, continuing to examine the above example in which an oxide (e.g. suboxide) of just a few nanometers is desired. The controlled oxide 108 may exhibit further desirable characteristics in terms of density or stoichiometric features. Specifically, controlled oxide 108 is generally less dense and can therefore effect switching operations with lower voltages. Thus, even though controlled oxide 108 (e.g., grown in connection with $N_2O$ plasma) can be the same thickness as an oxide grown with introduction of pure $O_2$ plasma, controlled oxide 108 can be grown over a longer period (e.g., 15 seconds versus 5 seconds), enhancing manufacturability, and controlled oxide 108 can be less dense, enhancing operational characteristics such as reduced power consumption, lower heat and so on.

Figure 3B:
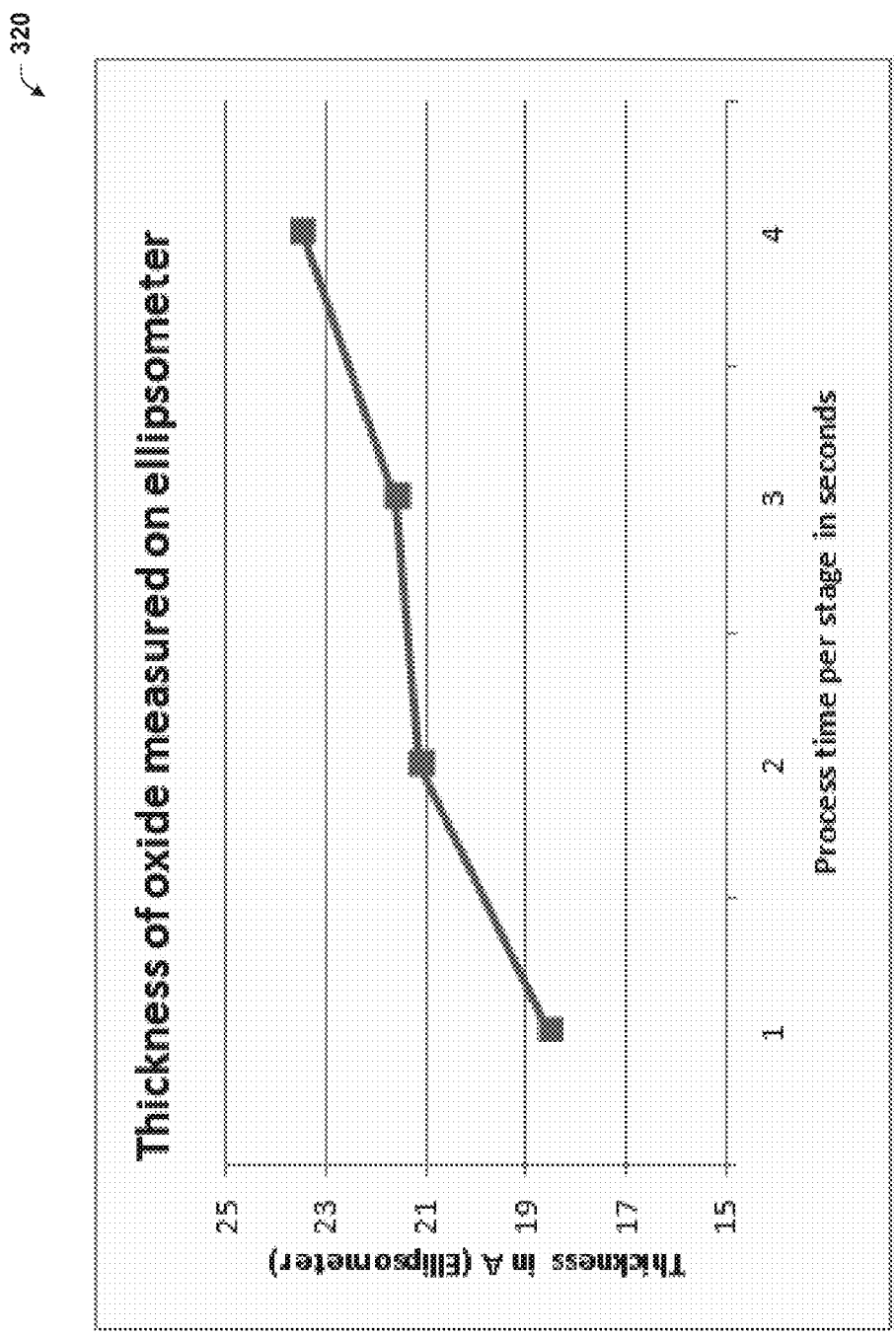
FIG. 3B illustrates a graph of example oxide thickness versus process or growth time in accordance with certain embodiments of this disclosure.

Moreover, due in part to a slower growth of oxide 108 in connection with $N_2O$ plasma oxide, thicknesses can be reduced below the dimensions that are attainable with other techniques. For example, when using $N_2O$ plasma, oxide 108 can be grown to thicknesses measured in Ångströms (A). While still referring to FIG. 3A, but turning also to FIG. 3B, graph 320 is depicted. Graph 320 illustrates example oxide 108 thicknesses as measured by, e.g., an ellipsometer, versus process or growth times. As depicted, growth times ranging from 1 to 4 seconds can yield a thickness for oxide 108 of between about 18 A to about 23 A. Hence, by utilizing techniques described herein, oxide 108 can be grown to a thickness of between 20-25 A in a controlled fashion in a manufacturing environment at low temperatures compatible with a CMOS substrate.

Still referring to FIG. 3A, in some embodiments, system 300 (or system 100) can further include cleaning component 304 that can be configured to facilitate cleaning of silicon bearing layer 104 prior to formation of interface layer 106. For example, native oxides due to prior and/or uncontrolled exposure can form on silicon bearing layer 104. These or any other oxides or contaminants can be cleaned during the cleaning process. Thereafter, the oxidation period can begin and controlled oxide 108 can be grown fresh.

In some embodiments, system 300 (or system 100) can further include deposition component 306. Deposition component 306 can be configured to facilitate deposition of active metal layer 110, upon which second terminal 114 can thereafter be positioned. Once active metal layer 110 is deposited, interface layer 106 is no longer exposed to plasma 118 or other reactive materials, so deposition of active metal layer 110 can constitute the end of the oxidation period, terminating further oxide growth so interface layer 106 will typically remain at the existing thickness.

In some embodiments, an interface material may be disposed between active metal layer 110 and interface layer 106. The interface material may be a titanium, titanium oxide, tungsten, or other barrier material. In various embodiments, the interface material may serve as a barrier (e.g. tunneling layer) between ions of the active metal layer and interface layer 106.

Figure 4A:
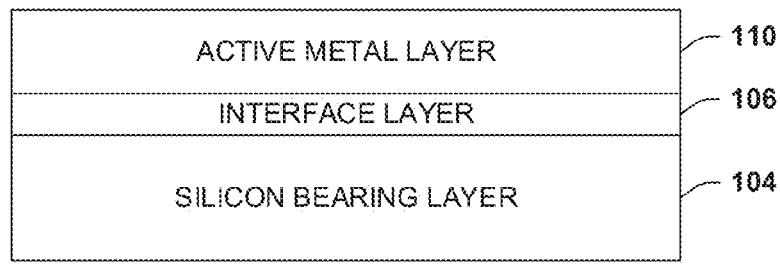
FIG. 4A depicts an example formation of the interface layer in connection with a deposit metal/etch scheme in accordance with certain embodiments of this disclosure.
Figure 4B:
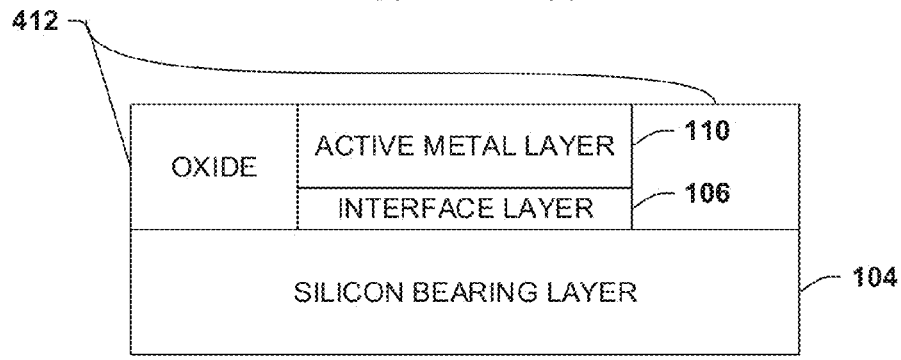
FIG. 4B depicts an example formation of the interface layer in connection with an etch/deposit metal scheme in accordance with certain embodiments of this disclosure.

FIGS. 4A and 4B relate to two different fabrication techniques. Turning now to FIG. 4A, example 400 is provided. Example 400 relates to formation of interface layer in connection with a deposit metal/etch scheme. In contrast, example 410 of FIG. 4B relates to formation of interface layer 106 in connection with an etch/deposit metal scheme. In the latter example (e.g., example 410), oxide 412 has been etched to produce a central aperture in which interface layer 106 can be grown and active metal layer 110 deposited.

Example Method for Regulating Interface Layer Growth with $N_2O$

The aforementioned diagrams have been described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 5:
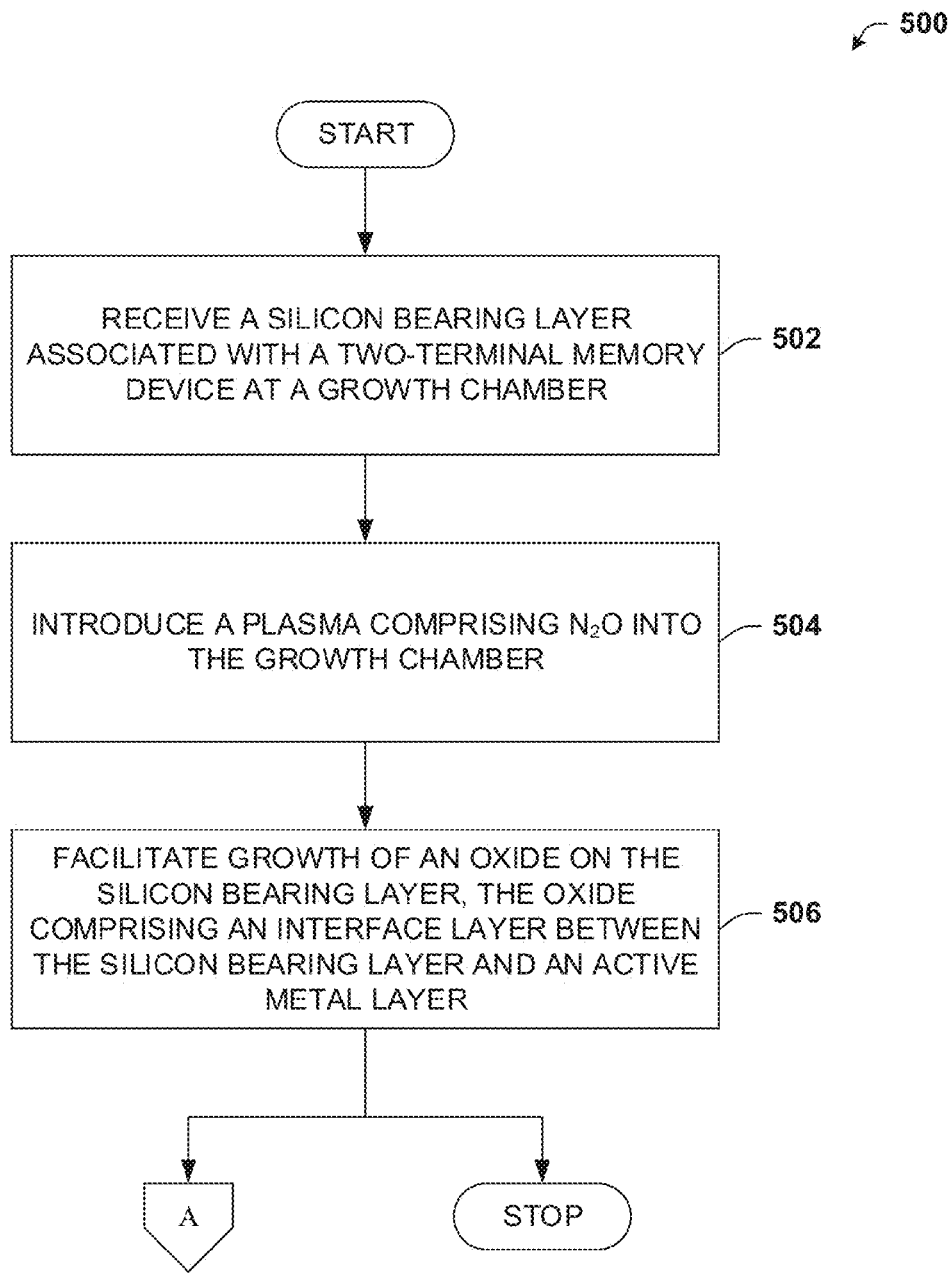
FIG. 5 illustrates an example methodology that can provide for regulating interface layer oxide growth with $N_2O$ plasma in accordance with certain embodiments of this disclosure.
Figure 6:
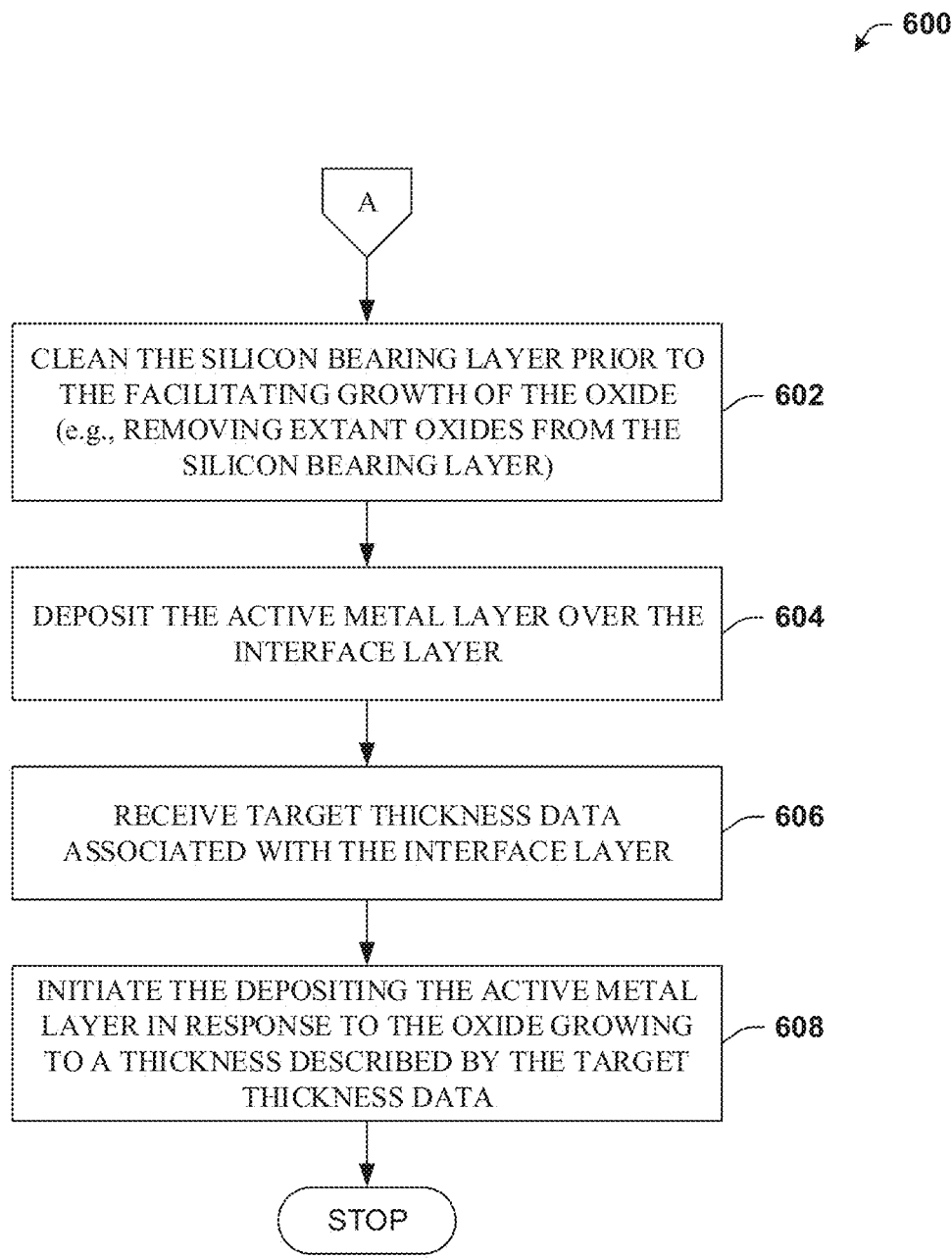
FIG. 6 illustrates an example methodology that can provide for additional features or aspects in connection with regulating interface layer growth of a two-terminal memory cell with $N_2O$ plasma in accordance with certain embodiments of this disclosure.

In view of the exemplary diagrams described supra, process methods that can be implemented in accordance with the disclosed subject matter will be better appreciated with reference to the flow chart of FIGS. 5 and 6. While for purposes of simplicity of explanation, the method of FIGS. 5 and 6 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 5 illustrates exemplary method 500. Method 500 can provide for regulating interface layer oxide growth with $N_2O$ plasma. For example, at reference numeral 502, a silicon bearing layer associated with a two-terminal memory device can be received at a growth chamber. In some embodiments, the silicon bearing layer can exist atop a CMOS substrate, in which case a growth process that occurs at relatively high temperatures (e.g., above 300-450 degrees Celsius) can damage or ruin elements of the CMOS substrate.

At reference numeral 504, a plasma comprising $N_2O$ can be introduced into the growth chamber. In some embodiments, substantially the entire environment associated with the growth chamber can consist of the $N_2O$ plasma that is introduced.

At reference numeral 506, growth of an oxide can be facilitated on the silicon bearing layer. This oxide can constitute an interface layer of the two-terminal memory cell, wherein the interface layer is situated between the silicon bearing layer and an active metal layer.

With reference now to FIG. 6, example method 600 is depicted. Method 600 can provide for additional features or aspects in connection with regulating interface layer growth of a two-terminal memory cell with $N_2O$ plasma. For instance, at reference numeral 602, the silicon bearing layer can be cleaned prior to the facilitating growth of the oxide that can occur in connection with reference numeral 506 of FIG. 5. Cleaning the silicon bearing layer can include removing other oxides, contaminants, or other undesired elements that exist on the silicon bearing layer prior to the cleaning.

At reference numeral 604, the active metal layer can be deposited over the interface layer. By depositing the active metal layer on the interface layer, the oxidation process (associated with the oxide being grown that comprises the interface layer) is concluded. As a result, in some embodiments, deposition of the active metal layer can coincide with the oxide reaching a target thickness, which is further detailed in connection with reference numerals 606 and 608. As discussed previously, in some embodiments, an interface material may be deposited prior to depositing the active metal material in step 604. The deposition of the interface material may also be within the restrictions for CMOS fabrication techniques.

For example, at reference numeral 606, target thickness data associated with the interface layer and/or an oxide comprising the interface layer can be received. At reference numeral 608, the depositing of the active metal layer described with reference to reference numeral 604 can be initiated in response to the oxide growing to a thickness described by the target thickness data.

Example Operating Environments

Figure 7:
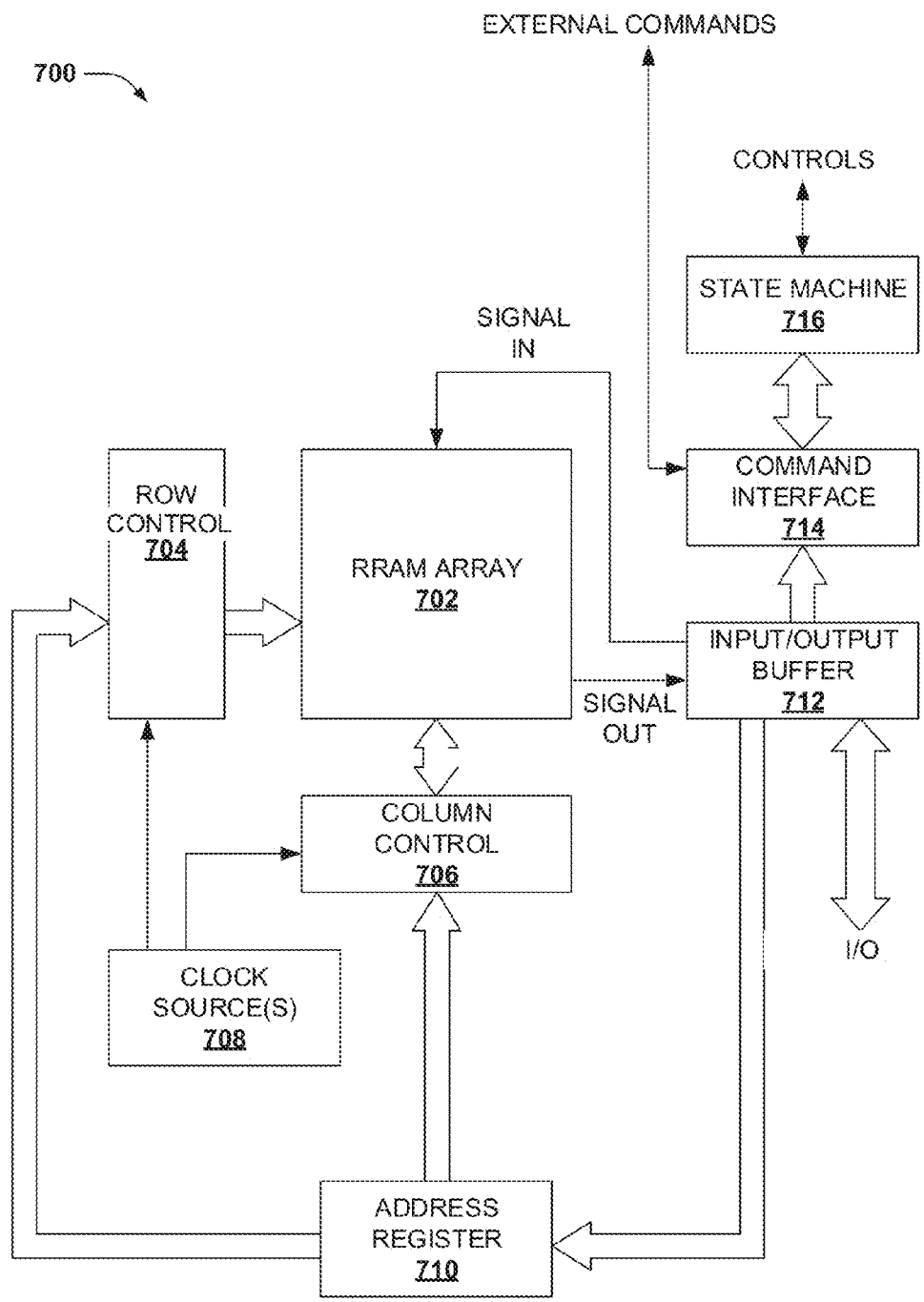
FIG. 7 illustrates a block diagram of an example electronic operating environment in accordance with certain embodiments of this disclosure.

In order to provide a context for the various aspects of the disclosed subject matter, FIG. 7, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 7 illustrates a block diagram of an example operating and control environment 700 for a RRAM array 702 according to aspects of the subject disclosure. In at least one aspect of the subject disclosure, RRAM array 702 can comprise a variety of RRAM memory cell technology. Particularly, RRAM array can be configured or operated to mitigate or avoid sneak path currents of the RRAM array, as described herein.

A column controller 706 can be formed adjacent to RRAM array 702. Moreover, column controller 706 can be electrically coupled with bit lines of RRAM array 702. Column controller 706 can control respective bitlines, applying suitable program, erase or read voltages to selected bitlines.

In addition, operating and control environment 700 can comprise a row controller 704. Row controller 704 can be formed adjacent to column controller 706, and electrically connected with word lines of RRAM array 702. Row controller 704 can select particular rows of memory cells with a suitable selection voltage. Moreover, row controller 704 can facilitate program, erase or read operations by applying suitable voltages at selected word lines.

A clock source(s) 708 can provide respective clock pulses to facilitate timing for read, write, and program operations of row control 704 and column control 706. Clock source(s) 708 can further facilitate selection of word lines or bit lines in response to external or internal commands received by operating and control environment 700. An input/output buffer 712 can be connected to an external host apparatus, such as a computer or other processing device (not depicted) by way of an I/O buffer or other I/O communication interface. Input/output buffer 712 can be configured to receive write data, receive an erase instruction, output readout data, and receive address data and command data, as well as address data for respective instructions. Address data can be transferred to row controller 704 and column controller 706 by an address register 710. In addition, input data is transmitted to RRAM array 702 via signal input lines, and output data is received from RRAM array 702 via signal output lines. Input data can be received from the host apparatus, and output data can be delivered to the host apparatus via the I/O buffer.

Commands received from the host apparatus can be provided to a command interface 714. Command interface 714 can be configured to receive external control signals from the host apparatus, and determine whether data input to the input/output buffer 712 is write data, a command, or an address. Input commands can be transferred to a state machine 716.

State machine 716 can be configured to manage programming and reprogramming of RRAM array 702. State machine 716 receives commands from the host apparatus via input/output interface 712 and command interface 714, and manages read, write, erase, data input, data output, and like functionality associated with RRAM array 702. In some aspects, state machine 716 can send and receive acknowledgments and negative acknowledgments regarding successful receipt or execution of various commands.

To implement read, write, erase, input, output, etc., functionality, state machine 716 can control clock source(s) 708. Control of clock source(s) 708 can cause output pulses configured to facilitate row controller 704 and column controller 706 implementing the particular functionality. Output pulses can be transferred to selected bit lines by column controller 706, for instance, or word lines by row controller 704, for instance.

In connection with FIG. 8, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 8:
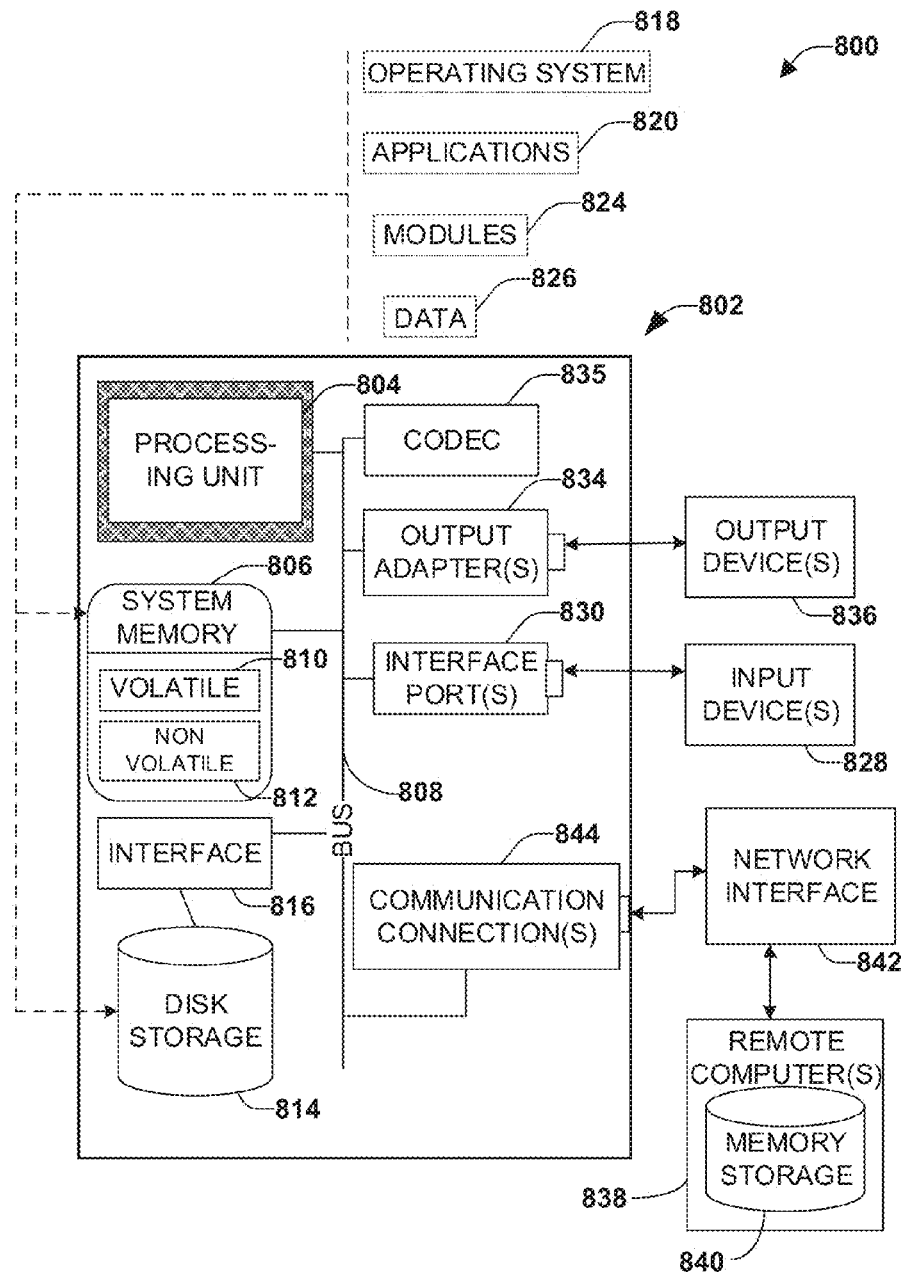
FIG. 8 illustrates an example schematic block diagram for a computing environment in accordance with certain embodiments of this disclosure.

With reference to FIG. 8, a suitable environment 800 for implementing various aspects of the claimed subject matter includes a computer 802. The computer 802 includes a processing unit 804, a system memory 806, a codec 835, and a system bus 808. The system bus 808 couples system components including, but not limited to, the system memory 806 to the processing unit 804. The processing unit 804 can be any of various available processors. Dual microprocessors and other multiprocessor architectures also can be employed as the processing unit 804.

The system bus 808 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 806 includes volatile memory 810 and non-volatile memory 812. The basic input/output system (BIOS), containing the basic routines to transfer information between elements within the computer 802, such as during start-up, is stored in non-volatile memory 812. In addition, according to present innovations, codec 835 may include at least one of an encoder or decoder, wherein the at least one of an encoder or decoder may consist of hardware, software, or a combination of hardware and software. Although, codec 835 is depicted as a separate component, codec 835 may be contained within non-volatile memory 812. By way of illustration, and not limitation, non-volatile memory 812 can include read only memory (ROM), programmable ROM (PROM), electrically programmable ROM (EPROM), electrically erasable programmable ROM (EEPROM), or flash memory. Volatile memory 810 includes random access memory (RAM), which acts as external cache memory. According to present aspects, the volatile memory may store the write operation retry logic (not shown in FIG. 8) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 802 may also include removable/non-removable, volatile/non-volatile computer storage medium. FIG. 8 illustrates, for example, disk storage 814. Disk storage 814 includes, but is not limited to, devices like a magnetic disk drive, solid state disk (SSD) floppy disk drive, tape drive, Jaz drive, Zip drive, LS-100 drive, flash memory card, or memory stick. In addition, disk storage 814 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 814 to the system bus 808, a removable or non-removable interface is typically used, such as interface 816. It is appreciated that storage devices 814 can store information related to a user. Such information might be stored at or provided to a server or to an application running on a user device. In one embodiment, the user can be notified (e.g., by way of output device(s) 836) of the types of information that are stored to disk storage 814 and/or transmitted to the server or application. The user can be provided the opportunity to opt-in or opt-out of having such information collected and/or shared with the server or application (e.g., by way of input from input device(s) 828).

It is to be appreciated that FIG. 8 describes software that acts as an intermediary between users and the basic computer resources described in the suitable operating environment 800. Such software includes an operating system 818. Operating system 818, which can be stored on disk storage 814, acts to control and allocate resources of the computer system 802. Applications 820 take advantage of the management of resources by operating system 818 through program modules 824, and program data 826, such as the boot/shutdown transaction table and the like, stored either in system memory 806 or on disk storage 814. It is to be appreciated that the claimed subject matter can be implemented with various operating systems or combinations of operating systems.

A user enters commands or information into the computer 802 through input device(s) 828. Input devices 828 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 804 through the system bus 808 via interface port(s) 830. Interface port(s) 830 include, for example, a serial port, a parallel port, a game port, and a universal serial bus (USB). Output device(s) 836 use some of the same type of ports as input device(s) 828. Thus, for example, a USB port may be used to provide input to computer 802 and to output information from computer 802 to an output device 836. Output adapter 834 is provided to illustrate that there are some output devices 836 like monitors, speakers, and printers, among other output devices 836, which require special adapters. The output adapters 834 include, by way of illustration and not limitation, video and sound cards that provide a means of connection between the output device 836 and the system bus 808. It should be noted that other devices and/or systems of devices provide both input and output capabilities such as remote computer(s) 838.

Computer 802 can operate in a networked environment using logical connections to one or more remote computers, such as remote computer(s) 838. The remote computer(s) 838 can be a personal computer, a server, a router, a network PC, a workstation, a microprocessor based appliance, a peer device, a smart phone, a tablet, or other network node, and typically includes many of the elements described relative to computer 802. For purposes of brevity, only a memory storage device 840 is illustrated with remote computer(s) 838. Remote computer(s) 838 is logically connected to computer 802 through a network interface 842 and then connected via communication connection(s) 844. Network interface 842 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 844 refers to the hardware/software employed to connect the network interface 842 to the bus 808. While communication connection 844 is shown for illustrative clarity inside computer 802, it can also be external to computer 802. The hardware/software necessary for connection to the network interface 842 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system, comprising:
  a memory that stores computer executable components; and
  a processor that executes the following computer executable components stored in the memory:
    a memory fabrication component that facilitates fabrication of a two-terminal memory cell with an active region comprising a silicon bearing layer, an interface layer situated atop the silicon bearing layer, and an active metal layer situated atop the interface layer, the memory fabrication component comprising:
      a formation component that:
        determines a defined characteristic associated with an oxidation period characterized by growth of a controlled oxide comprising the interface layer; and
        facilitates introduction of an $N_2O$ plasma concentration according to a determined proportion that satisfies the defined characteristic of the oxidation period.

2. The system of claim 1, further comprising a cleaning component that facilitates cleaning of the silicon bearing layer prior to formation of the interface layer and initiation of the oxidation period.

3. The system of claim 1, further comprising a deposition component that facilitates deposition of the active metal layer and termination of the oxidation period.

4. The system of claim 1, wherein the interface layer has a thickness within a range of about 1 nanometer to about 12 nanometers.

5. The system of claim 1, wherein the $N_2O$ plasma introduced by the formation component is composed entirely of $N_2O$ in a plasma state.

6. The system of claim 1, wherein the $N_2O$ plasma comprises $N_2O$ in a plasma state and $O_2$ in a plasma state or $NH_3$ in a plasma state.

7. The system of claim 1, wherein the two-terminal memory cell is a resistive switching memory cell.

8. The system of claim 1, wherein the defined characteristic specifies a length of time for the oxidation period.

9. The system of claim 1, wherein the defined characteristic specifies a growth rate for the controlled oxide during the oxidation period.

10. The system of claim 1, wherein the defined characteristic specifies a density parameter associated with the controlled oxide.

11. A method for fabricating a two-terminal memory device, comprising:
  receiving a silicon bearing layer associated with a two-terminal memory device at a growth chamber;
  determining a defined characteristic associated with an oxide to be grown on the silicon bearing layer, wherein the oxide represents an interface layer between the silicon bearing layer and an active metal layer; and
  controlling introduction of a plasma comprising $N_2O$ into the growth chamber, wherein the controlling facilitates growth of the oxide in accordance with the defined characteristic.

12. The method of claim 11, further comprising cleaning the silicon bearing layer prior to the facilitating growth of the oxide.

13. The method of claim 12, wherein the cleaning the silicon bearing layer comprises removing extant oxides from the silicon bearing layer.

14. The method of claim 11, further comprising depositing the active metal layer over the interface layer.

15. The method of claim 14, further comprising receiving target thickness data associated with the interface layer.

16. The method of claim 15, further comprising initiating the depositing the active metal layer in response to the oxide growing to a thickness described by the target thickness data.

17. A non-transitory computer readable storage medium storing computer-executable instructions that, in response to execution, cause a device including a processor to perform operations, comprising:
  receiving data indicative of a substrate with a silicon bearing layer being received at a growth chamber;
  determining a defined characteristic associated with a controlled oxide to be grown on the silicon bearing layer, wherein the controlled oxide represents an interface layer between the silicon bearing layer and an active metal layer; and
  facilitating injection of a plasma into the growth chamber, the plasma comprising a proportion of $N_2O$ determined to effectuate the defined characteristic with respect to a formation of the controlled oxide.

18. The non-transitory computer readable storage medium of claim 17, wherein the operations further comprise facilitating cleaning of the silicon bearing layer prior to the facilitating injection of the plasma.

19. The non-transitory computer readable storage medium of claim 17, wherein the operations further comprise facilitating deposition of an active metal layer atop the interface layer.

20. The non-transitory computer readable storage medium of claim 17, wherein the operations further comprise facilitating the deposition of the active metal layer in response to a determination that the interface layer satisfies the defined characteristic.

* * * * *